US00RE45463E

(19) United States
(12) Reissued Patent
Haba

(10) Patent Number: US RE45,463 E
(45) Date of Reissued Patent: Apr. 14, 2015

(54) STACKED MICROELECTRONIC ASSEMBLIES WITH CENTRAL CONTACTS

(71) Applicant: Tessera, Inc., San Jose, CA (US)

(72) Inventor: Belgacem Haba, Saratoga, CA (US)

(73) Assignee: Tessera, Inc., San Jose, CA (US)

(21) Appl. No.: 13/847,269

(22) Filed: Mar. 19, 2013

Related U.S. Patent Documents

Reissue of:
(64) Patent No.: 7,061,121
Issued: Jun. 13, 2006
Appl. No.: 10/988,160
Filed: Nov. 12, 2004

U.S. Applications:
(60) Provisional application No. 60/519,130, filed on Nov. 12, 2003.

(51) Int. Cl.
*H01L 23/48* (2006.01)

(52) U.S. Cl.
CPC ..... *H01L 23/48* (2013.01)

(58) Field of Classification Search
USPC ..... 257/686, 777, 738, 778, 784, E23.085, 257/E25.006, 783, 786
See application file for complete search history.

(56) References Cited

U.S. PATENT DOCUMENTS

| | | | |
|---|---|---|---|
| 3,390,308 | A | 6/1968 | Marley |
| 3,923,359 | A | 12/1975 | Newsam |
| 4,371,744 | A | 2/1983 | Badet et al. |
| 4,371,912 | A | 2/1983 | Guzik |
| 4,489,364 | A | 12/1984 | Chance |
| 4,540,226 | A | 9/1985 | Thompson et al. |
| 4,551,746 | A | 11/1985 | Gilbert et al. |
| 4,558,397 | A | 12/1985 | Olsson |
| 4,638,348 | A | 1/1987 | Brown et al. |
| 4,734,825 | A | 3/1988 | Peterson |

(Continued)

FOREIGN PATENT DOCUMENTS

| | | |
|---|---|---|
| JP | 52-075981 | 6/1977 |
| JP | 56-61151 | 5/1981 |

(Continued)

OTHER PUBLICATIONS

"Megabyte Per Cubic Inch," Defense Science, May 1988, p. 56.

(Continued)

*Primary Examiner* — Andy Huynh
(74) *Attorney, Agent, or Firm* — Lerner, David, Littenberg, Krumholz & Mentlik, LLP

(57) ABSTRACT

A stacked microelectronic assembly includes a dielectric element and a first and second microelectronic element stacked one on top of the other with the first microelectronic element underlying at least a portion of the second microelectronic element. The first microelectronic element and the second microelectronic element have front surfaces on which exposed on a central region of the front surface are contacts. A spacer layer may be provided under a portion of the second microelectronic element opposite a portion of the second microelectronic element overlying the first microelectronic element. Additionally, a third microelectronic element may be substituted in for the spacer layer so that the first microelectronic element and the third microelectronic element are underlying opposing sides of the second microelectronic element.

23 Claims, 5 Drawing Sheets

(56) References Cited

U.S. PATENT DOCUMENTS

| | | | | |
|---|---|---|---|---|
| 4,754,316 | A | | 6/1988 | Reid |
| 4,761,681 | A | | 8/1988 | Reid |
| 4,841,355 | A | | 6/1989 | Parks |
| 4,868,712 | A | | 9/1989 | Woodman |
| 4,897,918 | A | | 2/1990 | Osaka et al. |
| 4,956,694 | A | | 9/1990 | Eide |
| 4,982,265 | A | | 1/1991 | Watanabe et al. |
| 4,994,902 | A | | 2/1991 | Okahashi et al. |
| 4,996,583 | A | | 2/1991 | Hatada |
| 4,996,587 | A | | 2/1991 | Hinrichsmeyer et al. |
| 5,028,986 | A | | 7/1991 | Sugano et al. |
| 5,045,921 | A | | 9/1991 | Lin et al. |
| 5,117,282 | A | | 5/1992 | Salatino |
| 5,128,831 | A | | 7/1992 | Fox, III et al. |
| 5,138,438 | A | | 8/1992 | Masayuki et al. |
| 5,148,265 | A | | 9/1992 | Khandros et al. |
| 5,172,303 | A | | 12/1992 | Bernardoni et al. |
| 5,198,888 | A | | 3/1993 | Sugano et al. |
| 5,222,014 | A | | 6/1993 | Lin |
| 5,247,423 | A | | 9/1993 | Lin et al. |
| 5,266,912 | A | | 11/1993 | Kledzik |
| 5,281,852 | A | | 1/1994 | Normington |
| 5,311,401 | A | | 5/1994 | Gates, Jr. et al. |
| 5,313,096 | A | | 5/1994 | Eide |
| 5,334,875 | A | | 8/1994 | Sugano et al. |
| 5,337,077 | A | | 8/1994 | Browne |
| 5,376,825 | A | | 12/1994 | Tukamoto et al. |
| 5,384,689 | A | | 1/1995 | Shen |
| 5,397,916 | A | | 3/1995 | Normington |
| 5,412,247 | A | | 5/1995 | Martin |
| 5,455,740 | A | | 10/1995 | Burns |
| 5,479,318 | A | | 12/1995 | Burns |
| 5,489,749 | A | | 2/1996 | DiStefano et al. |
| 5,543,664 | A | | 8/1996 | Burns |
| 5,548,091 | A | | 8/1996 | DiStefano et al. |
| 5,552,631 | A | | 9/1996 | McCormick |
| 5,552,963 | A | | 9/1996 | Burns |
| 5,600,541 | A | | 2/1997 | Bone et al. |
| 5,608,265 | A | | 3/1997 | Kitano et al. |
| 5,616,958 | A | | 4/1997 | Laine et al. |
| 5,625,221 | A | | 4/1997 | Kim et al. |
| 5,637,536 | A | | 6/1997 | Val et al. |
| 5,639,695 | A | | 6/1997 | Jones et al. |
| 5,642,261 | A | | 6/1997 | Bond et al. |
| 5,656,856 | A | | 8/1997 | Kweon |
| 5,659,952 | A | | 8/1997 | Kovac et al. |
| 5,668,405 | A | | 9/1997 | Yamashita |
| 5,677,566 | A | | 10/1997 | King et al. |
| 5,681,777 | A | | 10/1997 | Lynch et al. |
| 5,701,031 | A | | 12/1997 | Oguchi et al. |
| 5,734,555 | A | | 3/1998 | McMahon |
| 5,751,063 | A | | 5/1998 | Baba |
| 5,783,870 | A | | 7/1998 | Mostafazadeh et al. |
| 5,784,264 | A | | 7/1998 | Tanioka |
| 5,801,439 | A | | 9/1998 | Fujisawa et al. |
| 5,804,874 | A | | 9/1998 | An et al. |
| 5,834,339 | A | | 11/1998 | Distefano et al. |
| 5,835,988 | A | | 11/1998 | Ishii |
| 5,844,315 | A | | 12/1998 | Melton et al. |
| 5,861,666 | A | | 1/1999 | Bellaar |
| 5,883,426 | A | | 3/1999 | Tokuno et al. |
| 5,977,640 | A | * | 11/1999 | Bertin et al. ..... 257/777 |
| 6,030,856 | A | | 2/2000 | DiStefano et al. |
| 6,072,233 | A | | 6/2000 | Corisis et al. |
| 6,093,029 | A | | 7/2000 | Kwon et al. |
| 6,180,881 | B1 | | 1/2001 | Isaak |
| 6,188,028 | B1 | * | 2/2001 | Haba et al. ..... 174/266 |
| 6,195,268 | B1 | | 2/2001 | Eide |
| 6,218,848 | B1 | | 4/2001 | Hembree et al. |
| 6,232,152 | B1 | | 5/2001 | DiStefano et al. |
| 6,268,649 | B1 | | 7/2001 | Corisis et al. |
| 6,291,259 | B1 | | 9/2001 | Chun |
| 6,303,997 | B1 | | 10/2001 | Lee |
| 6,313,522 | B1 | | 11/2001 | Akram et al. |
| 6,335,565 | B1 | | 1/2002 | Miyamoto et al. |
| 6,342,728 | B2 | | 1/2002 | Miyazaki et al. |
| 6,369,445 | B1 | | 4/2002 | Khoury |
| 6,388,264 | B1 | | 5/2002 | Pace |
| 6,462,421 | B1 | | 10/2002 | Hsu et al. |
| 6,496,026 | B1 | | 12/2002 | Long et al. |
| 6,515,870 | B1 | | 2/2003 | Skinner et al. |
| 6,703,713 | B1 | | 3/2004 | Tseng et al. |
| 6,818,474 | B2 | * | 11/2004 | Kim et al. ..... 438/108 |
| 7,294,928 | B2 | | 11/2007 | Bang et al. |
| 8,288,862 | B2 | * | 10/2012 | Khiang et al. ..... 257/706 |

FOREIGN PATENT DOCUMENTS

| | | | |
|---|---|---|---|
| JP | 57-31166 | A1 | 2/1982 |
| JP | 58-178529 | | 10/1983 |
| JP | 60-194548 | | 3/1984 |
| JP | 61-029140 | | 2/1986 |
| JP | 61-101067 | | 5/1986 |
| JP | 61-120454 | | 6/1986 |
| JP | 61-137335 | | 6/1986 |
| JP | 61-255046 | | 11/1986 |
| JP | 63-18654 | | 1/1988 |
| JP | 64-71162 | | 3/1989 |
| WO | 3019654 | A1 | 3/2003 |

OTHER PUBLICATIONS

"Three-Dimensional Packaging," Defense Science, May 1988, p. 65.
Forthun, U.S. Appl. No. 07/552,578, filed Jul. 13, 1990.
Newsam, U.S. Appl. No. 60/314,042, filed Aug. 22, 2001.

* cited by examiner

STACKED MICROELECTRONIC ASSEMBLIES WITH CENTRAL CONTACTS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application claims the benefit of the filing date of U.S. Provisional Patent Application No. 60/519,130 filed Nov. 12, 2003, the disclosure of which is hereby incorporated herein by reference.

BACKGROUND OF THE INVENTION

The present invention relates to stacked microelectronic assemblies and methods of making such assemblies, to methods of forming such assemblies and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of the circuit panel and the contacts on the chip are bonded directly to the circuit panel by solder balls or other connecting elements. The "flip chip" design provides a relatively compact arrangement; each chip occupies an area of the circuit panel equal to or slightly larger than the area of the chip's front face. However, this approach suffers from cost and reliability problems. As disclosed, for example, in certain embodiments of commonly-assigned U.S. Pat. Nos. 5,148,265; 5,148,266; and 5,679,977 the disclosures of which are incorporated herein by reference.

Certain innovative mounting techniques offer compactness approaching or equal to that of conventional flip-chip bonding without the reliability and testing problems commonly encountered in that approach. Packages which can accommodate a single chip in an area of the circuit panel equal to or slightly larger than the area of the chip itself are commonly referred to as "chip-sized packages."

Besides minimizing the planar area of the circuit panel occupied by microelectronic assembly, it is also desirable to produce a chip package that presents a low, overall height or dimension perpendicular to the plane of the circuit panel. Such thin microelectronic packages allow for placement of a circuit panel having the packages mounted therein in close proximity to neighboring structures, thus producing the overall size of the product incorporating the circuit panel. Various proposals have been advanced for providing plural chips in a single package or module. In the conventional "multi-chip module", the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module.

It has also been proposed to package plural chips in a "stack" arrangement i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977 and 5,148,265 patents, and U.S. Pat. No. 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite these efforts in the art, further improvements would be desirable in the case of multi-chip packages for chips having contacts located substantially in central regions of the chips. Certain semiconductor chips, such as some memory chips, are commonly made with the contacts in one or two rows located substantially along a central axis of the chip.

SUMMARY OF THE INVENTION

One aspect of the present invention provides microelectronic assemblies including at least two microelectronic [element] *elements* having central contacts. A first microelectronic element faces downward and underlies a portion of the second microelectronic element. In the preferred embodiments, according to this aspect of the invention, the first and second microelectronic elements are provided with contacts located on front surfaces on the microelectronic elements. The contacts are disposed on a central region of the microelectronic elements. One or both of the microelectronic elements are electrically connected to terminals on the dielectric elements. Apertures may be included with the dielectric elements wherein the apertures underlie central regions of the microelectronic elements so that the dielectric element does not obstruct the contacts on the microelectronic elements. In certain, more preferred embodiments, terminals on the dielectric element are mobile relative to the first and second microelectronic [element] *elements*. In certain, more preferred embodiments, a spacer may be provided so as to underlie a second portion of the second microelectronic element. The spacer layer is placed on an opposing side of the second microelectronic element as compared to the first microelectronic element with the central region of the second microelectronic element being located between the spacer and the first microelectronic element. An adhesive layer may be used to connect the spacer layer or the first microelectronic element or both to the second microelectronic element.

A stacked assembly, according to a further aspect of the present invention, includes a first microelectronic element, a second microelectronic element and a third microelectronic element. Each microelectronic element has contacts disposed on its front surface about a central region of the element. The second microelectronic element overlies a portion of the first microelectronic element and the third microelectronic element; however, the central region of the second microelectronic element is unencumbered by either of the two. The first microelectronic element and the second microelectronic element may have substantially similar structures. As with the previous embodiment of the present invention, an adhesive layer may be provided so as to connect the first and/or third microelectronic elements to the second microelectronic element. A dielectric element may be provided so as to underlie all of the microelectronic elements; however, apertures in the dielectric element are provided underlying central regions of the microelectronic elements so as to not encumber contacts disposed on these elements. As with the first embodiment of the present invention, wire leads connect the microelectronic elements to conductive features located on the dielectric element. In either of the embodiments, wire bonds connecting contacts on the microelectronic elements to conductive elements on the dielectric element may also take the form of wire leads, frangible leads, strip-like leads or the like.

A stacked assembly, according to even still a further aspect of the present invention, may include a first microelectronic element and a second microelectronic element. Both microelectronic elements having contacts disposed along their central regions may be directly connected to a circuit board or other microelectronic element via a mass of conductive material. Examples of this massive conductive material include solder, solder-core ball mass, a spring with solder fill, lands solder or the like. As is consistent with the stacked assemblies of the present invention, the second microelectronic element overlies at least a portion of the first microelectronic element. A spacer layer may be provided so as to underline a portion of the second microelectronic element opposite the first microelectronic element. Furthermore, the spacer layer may take the form of a third microelectronic element also being directly connected to a circuit board or the like.

In yet a still further aspect of the present invention, underlying microelectronic elements, such as the first microelectronic element and the third microelectronic element of any of the four described assemblies, may include bond ribbons. Bond ribbons may be used for connecting contacts disposed on the front surface of the microelectronic elements to terminals on the front surface of a dielectric element. Bond ribbons may be connected to the contacts of the underlying microelectronic elements and may be deformed to a vertical extensive position by moving the microelectronic elements and the dielectric element away from one another.

As with all embodiments of the present invention, an encapsulant material may be provided so as to cover and protect components of the microelectronic elements.

DETAILED DESCRIPTION

Figure 1:
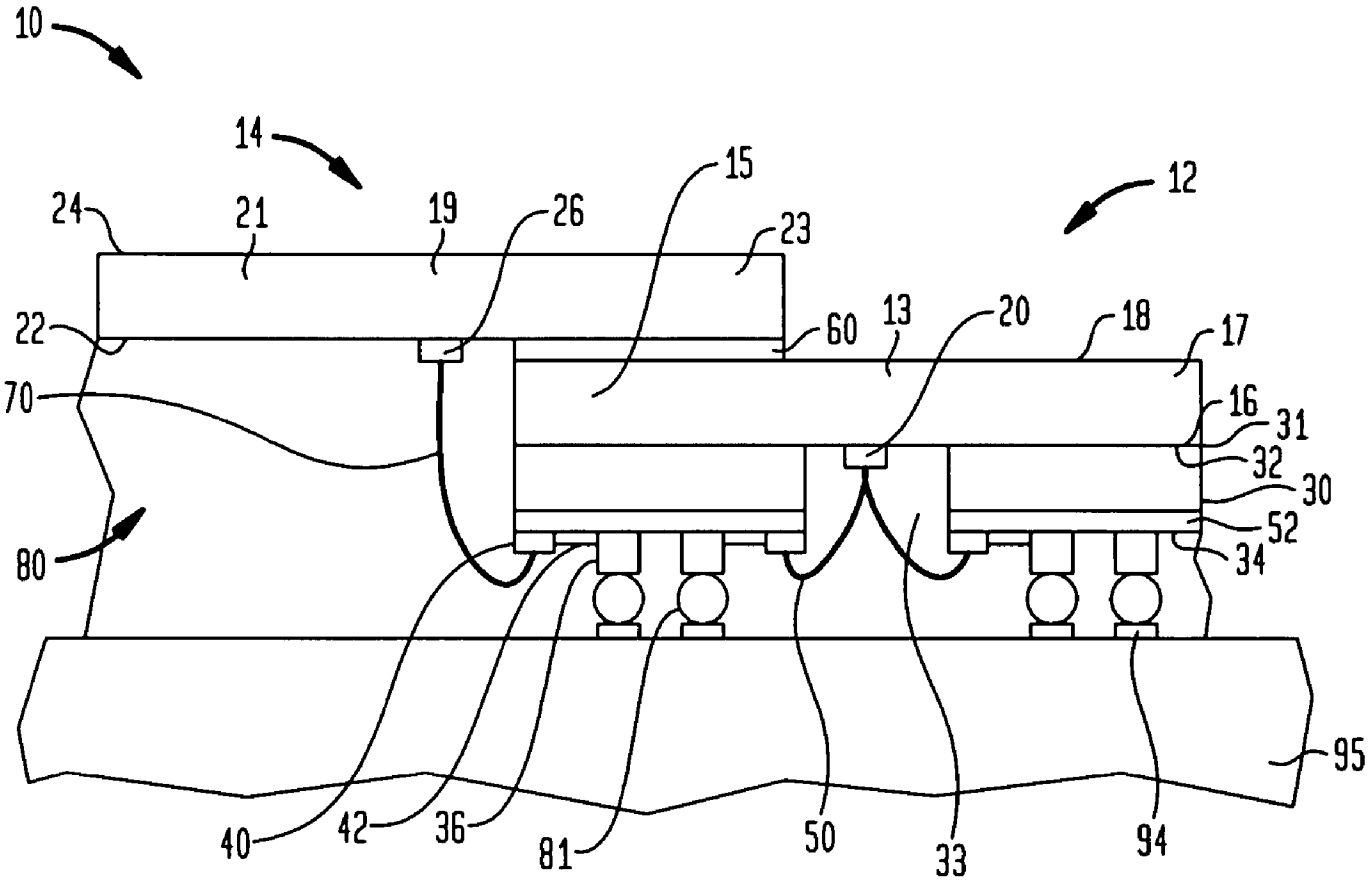
FIG. 1 is a diagrammatic sectional elevational view of the stacked assembly according to a first embodiment of the present invention.

As shown in FIG. 1, a stacked microelectronic assembly 10 according to one embodiment of the present invention includes a first microelectronic element 12 and a second microelectronic element 14. Microelectronic element 12 has a front surface 16 and a back surface 18 opposite the front surface 16. Microelectronic element 12 further includes central region 13 and first and second end regions 15 and 17, adjacent to central region 13. Electrical contacts 20 are exposed on front surface 16. As used in this disclosure, a statement that a conductive feature such as a terminal, contact, bonding pad or the like is "exposed on" a surface or structure means that it is accessible to be electrically connected with another conductive element which approaches the surface. The conductive feature may be flush with the specified surface, may project outwardly from such surface, or may be recessed relative to such surface.

Contacts 20 on the first microelectronic element 12 are exposed within central region 13 of front surface 16. For example, contacts 20 may be formed as one or two parallel rows adjacent to the center of surface 16. Microelectronic element 14 is arranged similarly to microelectronic element 12, in that it has a front surface 22, a back surface 24 opposite the front surface and electrical contacts 26 are exposed on the front surface 22. Microelectronic element 14 also includes a central region 19 and first and second end regions 21 and 23 adjacent to central region 19. In the first embodiment of the invention, as shown in FIG. 1, each microelectronic element 12 and 14 is a conventional semiconductor chip. Similarly, contacts 26 of second microelectronic element 14 are disposed within central region 19 of front surface 22 and may also be formed as one or two parallel rows adjacent the center of front surface 22.

The front surface 16 of the first microelectronic element faces downwardly. Second microelectronic element 14 overlies first microelectronic element 12 with the front surface 22 of the second microelectronic element also facing downwardly. Front surface 22 of second microelectronic element 14 and back surface 18 of first microelectronic element 12 confront each other in a "front-to-back" configuration. With regard to the present disclosure, terms such as "downwardly" or "upwardly" are used to describe directions that are opposed to each other without regard to any gravitational frame of reference. Similarly, terms such as "over" and "under", or "above" and "below" are used to describe the relative position to elements or assembly within the frame of reference of the assembly itself.

Second end region 23 of microelectronic element 14 overlies first end region 15 of microelectronic element 12. The actual percentage of microelectronic element 14 which overlies microelectronic element 12 is not important but what is important is that the portion of front surface 22 of microelectronic element 14 which has disposed within in it contacts 26, i.e. central region 19, does not overlie microelectronic element 12. Thus specific dimensions of central region 19 and first and second end regions 21 and 23 may fluctuate depending on where and how many contacts 26 are disposed on front surface 22. Furthermore, a sufficient area of front surface 22 should overlie microelectronic element 12 so as to support microelectronic element 14.

The assembly also includes a dielectric element 30 having a first surface 32 and a second surface 34 with electrically conductive terminals 36 exposed on second surface 34. Dielectric element 30 includes aperture 33 located substantially under central region 13 of microelectronic element 12 so as not to obstruct contacts 20. Microelectronic element 12 is disposed over first surface 32 of dielectric element 30 in a downwardly-facing orientation with front surface 16 confronting upwardly-facing first surface 32. Preferably, dielectric element 30 comprises a layer of flexible material, such as a layer of polyimide, BT resin or other dielectric material of the type commonly utilized for making tape automated bonding ("TAB") tapes, or a relatively rigid, board-like material such as a thick layer of fiber-reinforced epoxy as, for example, an Fr-4 or Fr-5 board and a layer of a die attach adhesive 31 defining the first surface 32. Dielectric element 30 also includes additional conductive features including bond pads 40 exposed on second surface 34 and conductive traces 42 connecting bond pads 40 to terminals 36.

Figure 2:
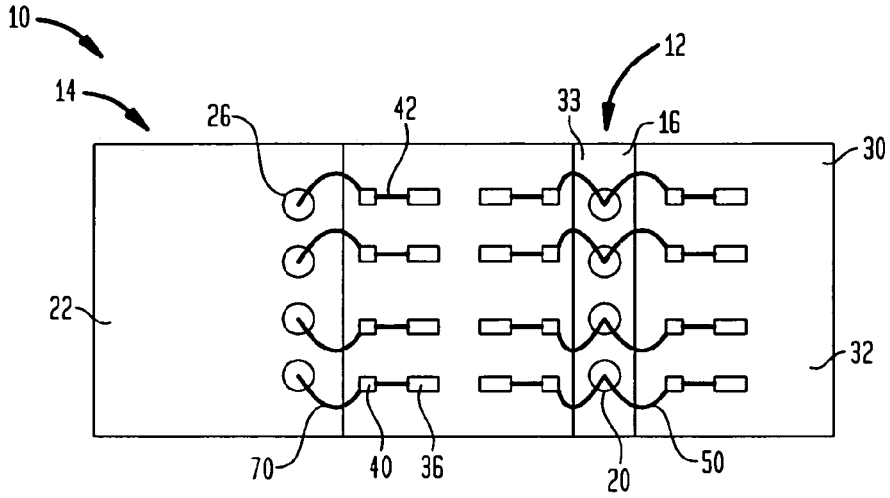
FIG. 2 is a bottom view of the stacked assembly according to a first embodiment of the present invention.

As shown in FIGS. 1 and 2, leads 50 are in the form of wire bonds, and are used to connect contacts 20 of first microelectronic element 12 to some of the bond pads 40. Other leads in the form of wire bonds 70 are used to connect contacts 26 of second microelectronic element 14 to other bond pads 40. The dielectric element may further include a solder-mask layer 52 defining the second surface 34, with apertures or holes at bond pads 40. Preferably, at least some of the wire bonds 50, 70 are connected through bond pads 40 and traces 42 to at least some of the terminals 36.

Most preferably, all of the conductive features on the dielectric element are formed from a single layer of metal. This avoids the need for precise registration between multiple layers of metallic features and formation of interconnections between such layers during manufacture of the dielectric element. Additional metallic features (not shown) such as conductive planes for use as ground planes or power distribution planes may be provided.

An adhesive layer 60 may connect microelectronic elements 12 and 14. Adhesive layer 60 may be a die-attach adhesive, and may be comprised of low elastic modulus material such as a silicone elastomer. However, where the two microelectronic elements are conventional semiconductor chips formed from the same material, they will tend to expand and contract in unison in response to temperature changes and, accordingly, a relatively rigid attachment as, for example, a thin layer of a high elastic modulus adhesive or solder can be employed.

As illustrated in FIG. 1, at least some of the terminals 36 are disposed beneath front surface 16 of microelectronic element 12. At least some of the terminals 36 are movable with respect to the first electronic element 12 and hence with respect to at least some of contacts 20.

Assembly 10 may further include an encapsulant 80 that covers leads 50, 70 and protects the microelectronic elements 12, 14. The encapsulant may also be provided between the front surfaces 16, 22 and the first surface 32, thoroughly surrounding leads 50, 70, and may fill open spaces between microelectronic elements 12 and 14. Preferred encapsulants comprise flexibilized epoxies or silicone elastomers.

Assembly 10 may further include a plurality of joining units, such as eutectic solder balls 81, as shown in FIG. 1. Solder balls 81 are attached to terminals 36 and hence are electrically interconnected to at least some of the bond pads 40, leads 50 and 70 and contacts 20 and 26. Other types of joining units such as solid-core solid balls or masses or balls of a diffusion-bonding or eutectic bonding alloy, masses of conductive polymer composition, or the like may be employed. In use, the assembly is mounted on a circuit panel such as circuit board 95 having contact pads 94. The second surface 34 of the dielectric element 30 faces downwardly towards the circuit board, and solder balls 81 are bonded to the contact pads of the circuit board, thus connecting the contact pads to the microelectronic elements. The contact pads on the circuit board are connected by traces on or in the circuit board to the other elements of an electrical circuit which must co-act with microelectronic elements 12 and 14. During the bonding operation, and during operation of the completed circuit board and circuit, differential thermal expansion and contraction of the circuit board and chips may occur. This may be caused by the difference between the coefficient of expansion of the microelectronic elements and circuit board; by difference in temperature between the microelectronic elements and the circuit board; or by combinations of these factors. Such differential thermal expansion causes some or all of the contact pads 95 to move relative to the microelectronic element and contacts 20 and 26. Desirably, movement of terminals 36 relative to microelectronic elements relieves some or all of the stress which would otherwise be imposed on solder balls 81 by relative movement of the terminals and contact pads. To enhance moveability of terminals 36 relative to the microelectronic elements, dielectric element 30 may include a compliant layer. For example, die attach adhesive 31 may be a compliant die attach adhesive. Additionally, movement of terminals allows for easier testability. This is due to the fact that if either terminals 36 or contact pads located on a tester are not in exact planer alignment, terminals 36 are sufficiently flexible so as to be able to align most terminals with a corresponding contact pad. In other words, movement of terminals 36 enhance the engageability of a test fixture to the microelectronic assembly.

Preferred combinations of the features described above allow the manufacture of a two-chip center stack assembly having a thickness of less than 1.2 mm above the terminals 36. More preferably, such a thickness will be 0.7 mm (700 microns) or less.

In preferred embodiments of the present invention, joining units or solder balls 81 have a height of about 300 microns or less; more preferably, about 200 microns or less, and most preferably about 100 microns or less. Thus the overall height of the assembly above the circuit panel after assembly, including the height of the joining units, most preferably is about 1.5 mm or less, and most preferably about 1.3 mm or less. Joining units having such low heights, also know as "fine pitch" joining units, may be used to beneficially affect the assemblies wherein the terminals are moveable with respect to the microelectronic elements and relative to the contacts on the microelectronic elements. As discussed above, this moveability relieves the mechanical strain or deformation generated by differential thermal expansion of the microelectronic elements. Some of the deformation may also be relieved by flexure of the joining units connecting the assembly to a circuit panel, such as a printed circuit board. Larger joining units can flex to a greater extent than smaller ones and, therefore, relieve a greater amount of deformation without failure due to fatigue of the joining units. In preferred embodiments of the present invention, the movement of the terminals relative to microelectronic elements relieves a significant portion of such deformation, allowing the use of relatively small joining units while still maintaining acceptable levels of reliability. However, moveability is not essential in all embodiments.

Figure 3:
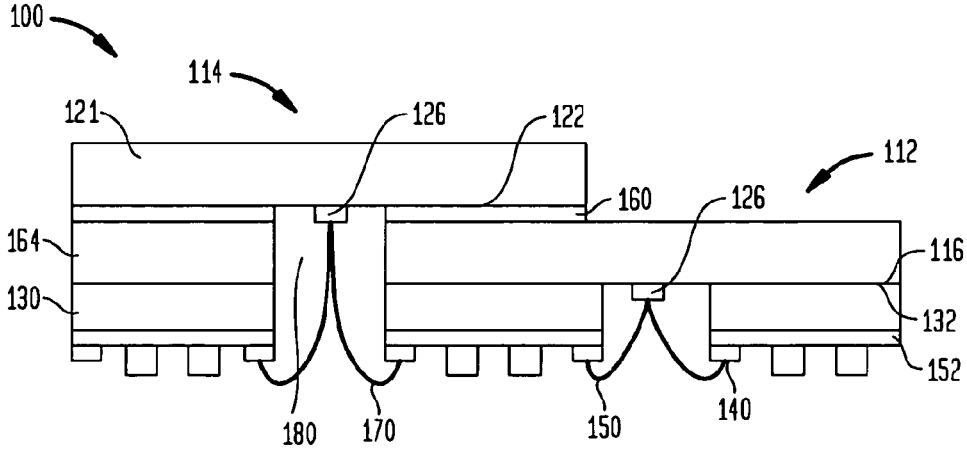
FIG. 3 is a view similar to FIG. 1 but depicting another embodiment of the present invention.

An alternate embodiment of the present invention is shown in FIG. 3. Microelectronic assembly 100 is similar to microelectronic element assembly 10 but also includes a spacer layer 164 disposed beneath first end region 121 of second microelectronic element 114 and may overlay a portion of dielectric element 130. Also, dielectric element 130 includes a second aperture aligned with the central region of the second microelectronic element. Spacer layer 164 is designed to balance and support microelectronic element 114 in conjunction with microelectronic element 112. Desirably, spacer layer 164 is made of a compliant material that allows movement of dielectric element 130, and hence movement of terminals 136, relative to contacts 120 and 126. Preferred materials for such compliant layers include epoxies and silicones, with flexibilized epoxies and silicone elastomers being particularly preferred. The leads 150, 170 are flexible to permit such movement.

Encapsulant 180 may be provided so as to protect and seal assembly 100, similar to assembly 10. In addition, in embodiments that do not include a separate spacer layer 164, the encapsulant may also be provided between the front surfaces 116, 122 and the first surface 132, thoroughly surrounding leads 150, 170, and may fill open spaces between microelectronic elements 112 and 114.

It is preferred, although not necessary to the invention, that microelectronic elements 112 and 114 are attached to each other by means such as adhesive layer 160. It is also preferred that microelectronic element 114 and spacer layer 164 are attached to each other by adhesive layer 160.

Figure 4:
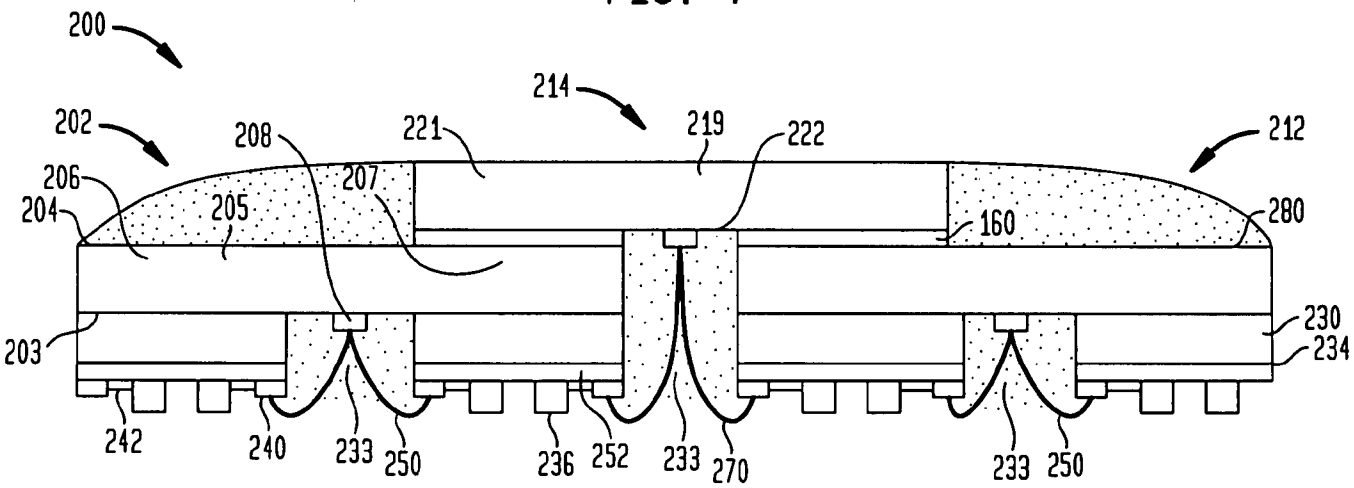
FIG. 4 is a side view similar to FIG. 1 but depicting another embodiment of the present invention.

In a third embodiment shown in FIG. 4, assembly 200 includes a third microelectronic element 202, along with first and second microelectronic elements 212, 214. Third microelectronic element 202 includes front surface 203, rear surface 204, central region 205 and first and second end regions 206 and 207. Electrical contacts 208 are disposed on front surface 203. Assembly 200 may be substantially similar to assembly 100 discussed above with reference to FIG. 3. The one significant difference is that microelectronic element 202 replaces spacer layer 164 underlying microelectronic element 214. Specifically, second end region 207 of microelectronic element 202 underlies first end region 221 of microelectronic element 214. Consistent with the first embodiment of the present invention, the percentage of front surface 222 overlying microelectronic element 202 may fluctuate depending on the number of contacts 226 located on front surface 222 of microelectronic element 214. In other words central region 219 of microelectronic element 214 must not overlie second end region 207 of microelectronic element 202. However, the amount of front surface 222 of microelectronic element 214 overlying second end region 207 of microelectronic element 202 should be sufficient to support microelectronic element 214 in conjunction with microelectronic element 212.

Similar to microelectronic 12 of FIG. 1, contacts 208 disposed on front surface 203 of microelectronic element 202 have wire bonds 250 in the form of leads for connecting contacts 208 to bond pads 240 of dielectric element 230. Dielectric element 230 may include solder mass layer 252 defining second surface 234 of dielectric element 230 with apertures or holes at bond pads 240. Dielectric element 230 can be seen as just a larger version of dielectric element 30 of assembly 10. Apertures 233 are provided in dielectric element 230 so that dielectric element 230 does not obstruct leads 250 or 270. The apertures are aligned with the central regions of each microelectronic element. Traces 242 connect the various conductive features to each other, as discussed in conjunction with the first embodiment of the present invention. Similarly, at least some of the leads 250 and 270 associated with microelectronic elements 202, 212 and 214 are connected to at least some of the terminals 236, whereas at least some bond pads 240 are also connected to at least some of the terminals 236. Some or all of the bonds pads 240 may be connected with some or all of the leads 250 and 270. Assembly 200 may further include an encapsulant 280 that covers the leads 250, and 270 and protects the microelectronic element 212, 214 and 202. Encapsulant 280 is similar to encapsulant 80 and can be employed for similar purposes.

The assembly 200 can be thought of as a brick wall having an A-B-A configuration wherein A designates a lower tier element such as first microelectronic element 212 or third microelectronic element 202, and B designates an upper tier microelectronic element such as second microelectronic element 214, and with the contact-bearing central regions arranged in the order indicated. Each upper tier element B overlies a portion of at least one lower tier element A and A' so as to form the structure shown in FIG. 4.

Figure 5:
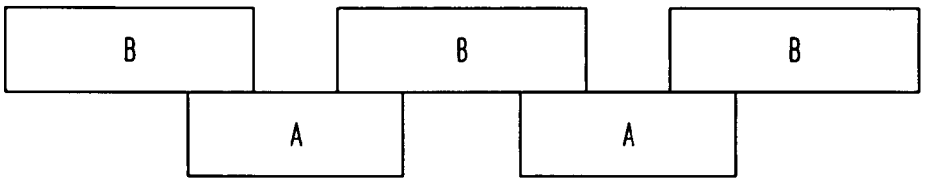
FIG. 5 is a block diagram side view depicting a basic design concept of the present invention.

As shown in FIG. 5, a third embodiment of the invention makes use of the A-B-A configuration by continuing the structure horizontally outwards. FIG. 5 is a skeletal depiction of a B-A-B-A-B configuration. The structure may have a configuration of A-B-A-B-A or A-B-A-B or B-A-B-A-B, or any other combination of the two where a structure A and a structure B are adjacent to one another. These structures could be extended out indefinitely until a required amount of microelectronics elements are met. Additionally, structures that follow varying designs such as having a plurality of A structures adjacent to one another without an overlying B structure may be employed.

Figure 6:
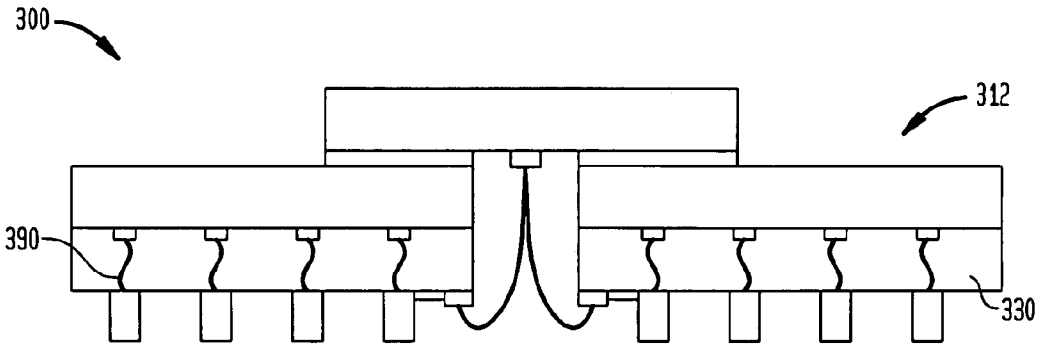
FIGS. 6, 7, and 8 are similar to FIG. 1 but depicting further embodiments of the present invention.

In an alternate embodiment of the present invention as shown in FIG. 6, assembly 300 includes microelectronic elements denoted by the structure A altered so as to include a substantially continuous dielectric element 330 underlying at least one microelectronic element denoted A. For this discussion microelectronic element 312 will represent microelectronic elements having a structure equal to A. Contacts 320 are electrically connected to bond ribbons leads 390. The bond ribbons may be of the type described in U.S. Pat. No. 5,518,964, the disclosure of which is incorporated by reference herein. As disclosed in certain embodiments of the '964 patent, the bond ribbons may be initially formed in place on the first surface of the dielectric element, and may initially extend in the plane of such surface. The bond ribbons may be connected to the contacts 320 of the first microelectronic element 312 and may be deformed to the vertical-extensive position depicted in FIG. 6 by moving the first microelectronic element 312 and the dielectric element 330 away from one another after bonding the ribbons to the contacts of the first microelectronic element. Related bond ribbon configurations and methods of forming bond ribbons embodiments are discussed in U.S. Pat. Nos. 6,329,607; 6,228,686; 6,191,368; 5,976,913; and 5,859,472, the disclosures of which are also incorporated by reference herein.

Figure 7:
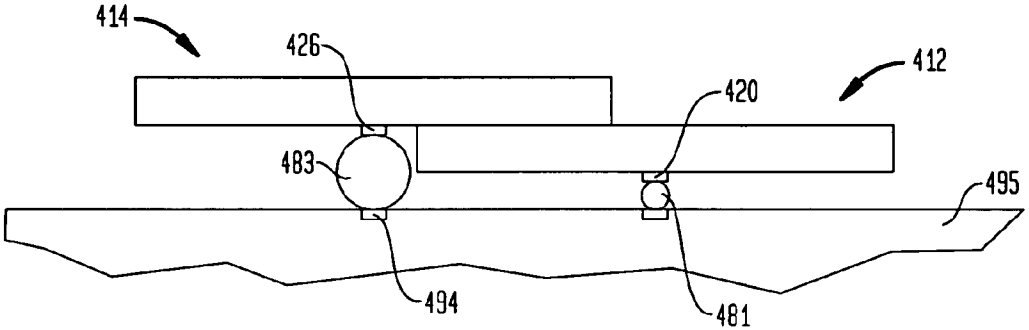

In a further alternate embodiment as shown in FIG. 7, assembly 400 includes first microelectronic element 412 and second microelectronic element 414. The microelectronic elements in assembly 400 may be substantially similar to the first and second microelectronic elements employed with assembly 10 of FIG. 1. However, assembly 400 differs from the previous assemblies in that the dielectric layer has not been included in the assembly. Additionally, masses of conductive material, preferably solder balls 481, are employed for conductively connecting contacts 420 of first microelectronic element 412 to the circuit board. Similar masses 483 connect contacts 426 of second microelectronic element 414 directly to contacts 494 of circuit board 495. In the mounted condition illustrated in FIG. 7, the masses 481 associated with the contacts 420 of the first microelectronic element have a lesser height than masses 483 associated with the second microelectronic element. Additionally, the conductive material may be comprised of other material as, for example, polymeric conductive materials, solid core solder balls, solder filled springs, solder land or the like. A combination of options may also be employed. As with all the previous embodiments, an adhesive layer (not shown) may connect microelectronic elements 412 and 414. Additionally, an encapsulant (also not shown) as with all embodiments of the present invention may be included with assembly 400. Although the elimination of the dielectric layer has been described with specific reference to assembly 400, the dielectric layer may be also eliminated from other embodiments described herein. Additionally, conductively connecting contacts on microelectronic elements directly to contacts on a circuit board, as shown in FIG. 7, may be incorporated with other embodiments described within the present application.

The embodiment shown in FIG. 7 may be assembled using various methods. For example, microelectronic element 412 may be preassembled to microelectronic element 414. The entire assembly may then be surface mounted to circuit board 495 using solder balls 481 with standard surface mount techniques known in the art. Additionally, microelectronic element 412 may be surface mounted to circuit board 495 first and in a next step, microelectronic element 414 is surface mounted to the circuit board.

Figure 8:
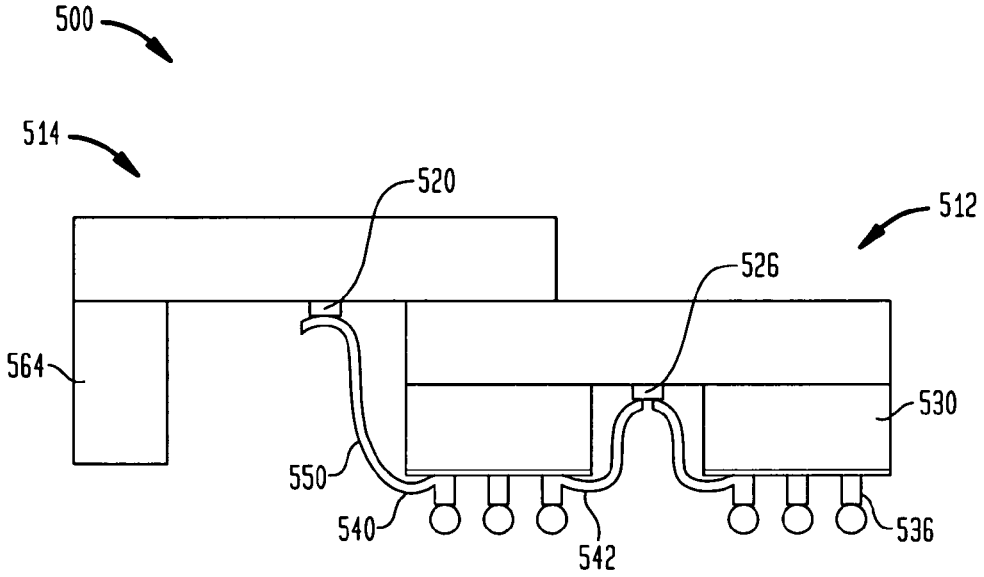

FIG. 8 shows assembly 500 employing alternate conducting leads connecting contacts 520 and 526 to other conductive features of the assembly. Assembly 500 may include any or all of the features previously described in this reference herein in conjunction with other embodiments of the present invention. The one significant modification to assembly 500 is that strip-like leads 550 formed integrally with traces 542 are used to connect contacts 520 and 526 to conductive features of the microelectronic elements. The construction of such strip-like leads is described, for example, in commonly assigned U.S. Pat. No. 5,915,752, which is hereby incorporated by reference herein. As shown in FIG. 8, assembly 500 may include a spacer layer 564 underlying second microelectronic element 514. As with all embodiments of the present invention, spacer layer 564 may be made of a compliant material or additionally, spacer layer 564 may be comprised of a small microelectronic element. In the case where spacer layer 564 is a small microelectronic element, the small microelectronic element may either not extend horizontally past second microelectronic element 514 or only extend slightly past the edge of microelectronic element 514. Various adhesive layers and encapsulants may be included with assembly 500, as described throughout this disclosure.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly comprising:

a dielectric element having an upwardly-facing first surface and a downwardly-facing second surface [and having], terminals exposed at said second surface*, a first aperture, and a second aperture*;

a first microelectronic element *overlying said dielectric element, the first microelectronic element* having an upwardly-facing rear surface and a downwardly-facing front surface and having contacts exposed at said front surface; and a second microelectronic element having an upwardly-facing rear surface and a downwardly-facing front surface, having contacts exposed at said front surface, said front surface of said second microelectronic element including a central region and [a] first and second end [region] *regions* on opposite sides of said central region, said contacts of said second microelectronic element being disposed in said central region *and facing downwardly toward said dielectric element*, said first [side] *end* region overlying said first microelectronic element, said central region and said second [side] *end* region projecting outwardly from said first microelectronic element*, said first aperture underlying said contacts of said first microelectronic element, said second aperture underlying said contacts of said second microelectronic element,* wherein said first and second microelectronic elements are electrically connected with said terminals.

2. The microelectronic assembly of claim 1, wherein said first microelectronic element has a central region and a first and second side region, said contacts of said first microelectronic element being disposed within said central region of said first microelectronic element.

[3. The microelectronic assembly of claim 1, wherein said dielectric element includes at least one aperture, said aperture substantially underlying said contacts of said front surface of said first microelectronic element.]

[4. The microelectronic assembly of claim 1, wherein said dielectric element includes at least one aperture, said aperture substantially underlying said contacts of said front surface of said second microelectronic element.]

5. The microelectronic assembly of claim 1, further comprising a spacer layer, wherein said second [side] *end* region of said second microelectronic element overlies said spacer layer.

6. The microelectronic assembly of claim 1, further comprising a third microelectronic element, wherein said second [side] *end* region of said second microelectronic element overlies said third microelectronic element.

7. The microelectronic assembly of claim 6, further comprising an adhesive layer, wherein said adhesive layer connects said first microelectronic element and said third microelectronic element to said second microelectronic element.

8. The microelectronic assembly of claim 2, further comprising a third microelectronic element, wherein said second *end* region of said second microelectronic element overlies said third microelectronic element.

9. The microelectronic assembly of claim 8, wherein said third microelectronic element is substantially similar to said first microelectronic element.

10. The microelectronic assembly of claim 9, wherein said dielectric element underlies at least a portion of said third microelectronic element.

11. The microelectronic assembly of claim 1, further comprising a first encapsulant material, wherein said first encapsulant material is disposed in contact with said first microelectronic element and said second microelectronic element.

12. The microelectronic assembly of claim 6, further comprising a first encapsulant material, wherein said first encapsulant material is disposed in contact with said first microelectronic element, said second microelectronic element and said third microelectronic element.

13. The microelectronic assembly of claim 1, further comprising an adhesive layer, wherein said adhesive layer connects said first microelectronic element to said second microelectronic element.

14. The microelectronic assembly of claim 1, further comprising wire leads, wherein said first and second microelectronic elements are electrically connected with said terminals via said wire leads.

15. The microelectronic assembly of claim 1, further comprising traces on said dielectric element connected to said terminals and leads integral with said traces, wherein said first and second microelectronic elements are electrically connected with said terminals via said leads.

[16. A microelectronic assembly comprising:

a dielectric element having an upwardly-facing first surface and a downwardly-facing second surface and having terminals exposed at said second surface;

a first microelectronic element having an upwardly-facing rear surface and a downwardly-facing front surface and having contacts exposed at said front surface; and a second microelectronic element having an upwardly-facing rear surface and a downwardly-facing front surface, having contacts exposed at said front surface, said front surface of said second microelectronic element including a central region and a first and second region on opposite sides of said central region, said contacts of said second microelectronic element being disposed in said central region, further wherein said first side region overlies said first microelectronic element, said central region and said second side region projecting outwardly from said first microelectronic element wherein said first and second microelectronic elements are electrically connected with said terminals.]

[17. A microelectronic assembly comprising:

a first microelectronic element having an upwardly-facing rear surface and a downwardly-facing front surface and having contacts exposed at said front surface; and a second microelectronic element having an upwardly-facing rear surface and a downwardly-facing front surface, having contacts exposed at said front surface, said front surface of said second microelectronic element including a central region and a first and second end region on opposite sides of said central region, said contacts of said second microelectronic element being disposed in said central region, said first side region overlying said first microelectronic element, said central region and said second side region projecting outwardly from said first microelectronic element.]

[18. The microelectronic assembly of claim 17, wherein said first microelectronic element has a central region and a first and second side region, said contacts of said first microelectronic element being disposed in said central region of said first microelectronic element.]

[19. The microelectronic assembly of claim 17, further comprising a spacer layer, wherein said second side region of said second microelectronic element is overlying said spacer layer.]

[20. The microelectronic assembly of claim 17, further comprising a third microelectronic element, wherein said second side region of said second microelectronic element is overlying said third microelectronic element.]

[21. The microelectronic assembly of claim 18, further comprising a third microelectronic element, wherein said second region of said second microelectronic element overlies said third microelectronic element.]

[22. The microelectronic assembly of claim 20, wherein said third microelectronic element is substantially similar to said first microelectronic element.]

[23. The microelectronic assembly of claim 17, further comprising a first encapsulant material, wherein said first encapsulant material is disposed in contact with said first microelectronic element and said second microelectronic element.]

[24. The microelectronic assembly of claim 17, further including an adhesive layer, wherein said adhesive layer connects said first microelectronic element to said second microelectronic element.]

[25. The microelectronic assembly of claim 20, further comprising an adhesive layer, wherein said adhesive layer connects said first microelectronic element and said third microelectronic element to said second microelectronic element.]

[26. The microelectronic assembly of claim 17, further comprising a circuit board and masses of conductive material, said masses of conductive material connecting said contacts of said first microelectronic element and said contacts of said second microelectronic element to said circuit board.]

[27. The microelectronic element assembly of claim 26, wherein said conductive material includes solder.]

*28. The microelectronic assembly of claim 1, wherein said dielectric element includes a first intermediate portion disposed between said first and second apertures, and said terminals include intermediate terminals disposed on said first intermediate portion.*

*29. The microelectronic assembly of claim 28 further comprising a third microelectronic element overlying said dielectric element, wherein said second end region of said second microelectronic element overlies said third microelectronic element.*

*30. The microelectronic assembly of claim 28 wherein said third microelectronic element has an upwardly-facing rear surface, a downwardly-facing front surface and contacts exposed at the front surface of the third microelectronic element.*

*31. The microelectronic assembly of claim 30 wherein said dielectric element includes a third aperture underlying said contacts of said third microelectronic element.*

*32. The microelectronic assembly of claim 31 wherein said dielectric element includes a second intermediate portion disposed between said second and third apertures and said terminals include second intermediate terminals disposed on said second intermediate portion.*

*33. The microelectronic assembly of claim 1, further comprising leads extending through said apertures, said contacts being connected to said terminals via said leads.*

*34. The microelectronic assembly of claim 33, wherein said leads include first leads extending through said first aperture to said contacts of said first microelectronic element and second leads extending through said second aperture to said contacts of said second microelectronic element.*

*35. The microelectronic assembly of claim 33 wherein said dielectric element includes bond pads exposed at said second surface and electrically connected to said terminals, and said leads include wire bonds extending through said apertures from said contacts to said bond pads.*

*36. The microelectronic assembly of claim 33, wherein said dielectric element includes a first intermediate portion disposed between said first and second apertures and said terminals include first intermediate terminals disposed on said first intermediate portion.*

*37. The microelectronic assembly of claim 36, wherein said leads include first leads extending through said first aperture to said contacts of said first microelectronic element and second leads extending through said second aperture to said contacts of said second microelectronic element.*

* * * * *